United States Patent [19]

Sugai

[11] Patent Number: 4,955,817
[45] Date of Patent: Sep. 11, 1990

[54] CONSTRUCTION FOR REMOVING ELECTRONIC CHARGES IN CONNECTORS

[75] Inventor: Hiroshi Sugai, Suwa, Japan

[73] Assignee: Seiko Epson Corporation, Tokyo, Japan

[21] Appl. No.: 308,870

[22] Filed: Feb. 10, 1989

[30] Foreign Application Priority Data

Feb. 12, 1988 [JP] Japan ................. 63-17295[U]

[51] Int. Cl.⁵ .................. H01R 13/453; H05K 1/14
[52] U.S. Cl. .................... 439/60; 439/137; 439/140; 439/924; 361/399
[58] Field of Search ............ 439/140, 141, 137, 131, 439/924, 136, 60; 361/395, 399; 360/133; 365/122; 902/11, 12

[56] References Cited

U.S. PATENT DOCUMENTS

| | | | |
|---|---|---|---|
| 3,973,817 | 8/1976 | Stalley et al. ................ | 439/60 |
| 4,510,553 | 4/1985 | Faultersack ................. | 439/924 |
| 4,592,608 | 6/1986 | Ohtsuka et al. .............. | 439/140 |
| 4,667,266 | 5/1987 | Masuoka et al. ............ | 361/399 X |
| 4,695,925 | 9/1987 | Kodai et al. ................. | 361/395 |
| 4,767,348 | 8/1988 | Murakami .................... | 439/140 |
| 4,780,791 | 10/1988 | Morita et al. ................ | 361/399 |
| 4,780,793 | 10/1988 | Ohtsuki ......................... | 439/137 |
| 4,789,347 | 12/1988 | Banjo et al. .................. | 439/137 X |

Primary Examiner—William Briggs
Attorney, Agent, or Firm—Blum Kaplan

[57] ABSTRACT

A construction for removing electrical charge generated in a data input device when the data input device is connected to a data storage device. Contacting members connected to a ground are provided on the connector of the electronic apparatus and contact conductive members of the input device to remove electrical charges prior to connecting the input terminals of the input device to the connector terminals of the electronic apparatus.

7 Claims, 3 Drawing Sheets

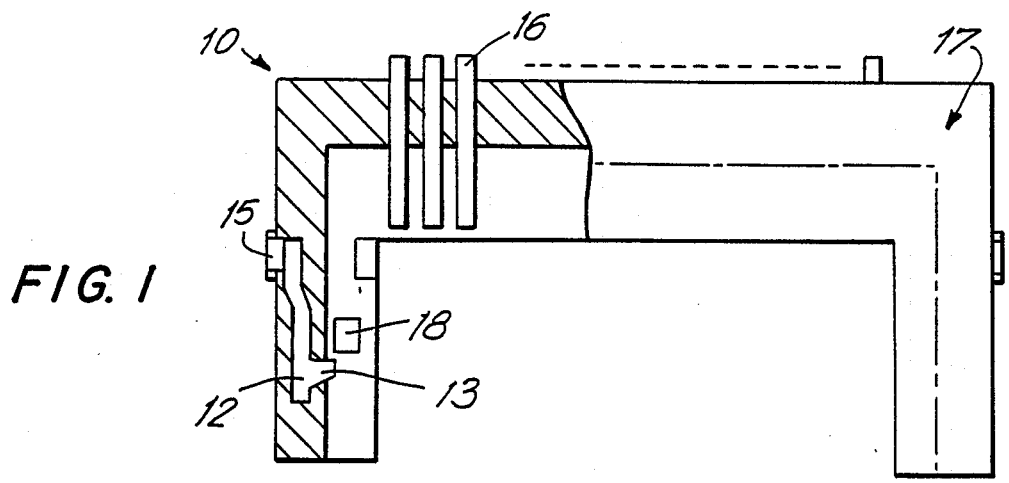
FIG. 1
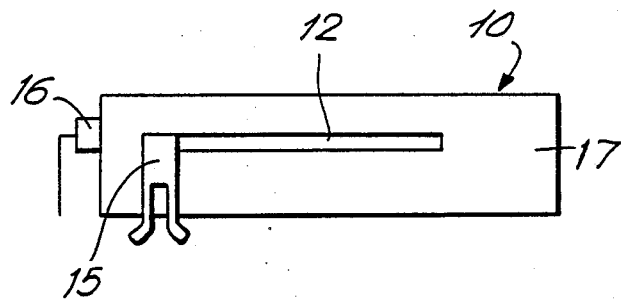
FIG. 2
FIG. 3
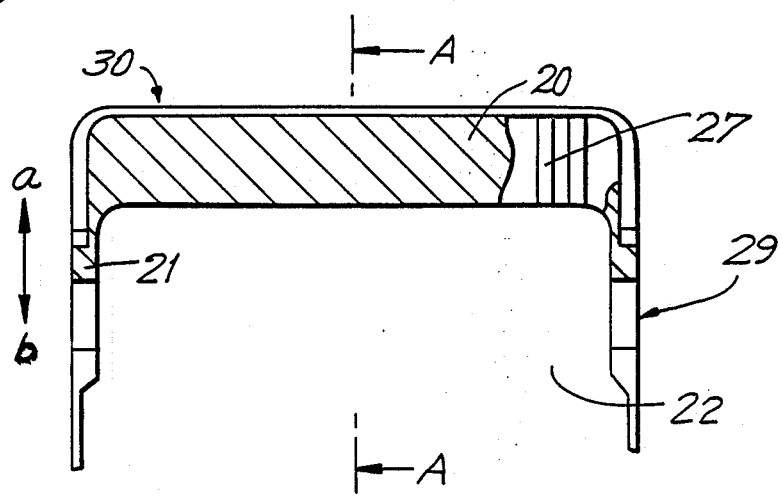

CONSTRUCTION FOR REMOVING ELECTRONIC CHARGES IN CONNECTORS

BACKGROUND OF THE INVENTION

This invention relates generally to a construction for connecting a data input device to an electronic apparatus, and more particularly to a construction for removing electrical charges stored in the data input device when the data input device is connected to the electronic apparatus.

Generally connectors for data input devices are electrically connected to an electronic apparatus or storage devices, such as a word processor, personal computer or other electronic apparatus, and the data stored in the data input device is transferred to the electronic apparatus. Charges may often be generated in the data input device during handling since the data input device is a portable instrument. When a data input device bearing charges is inserted to the connector of the electronic apparatus, the charges flow to the electronic apparatus through the connecting terminals of the connector. Thus, misoperation or damage to the integrated circuit of the electronic apparatus may result.

Japanese Patent Laid-Open No. 77996/87 describes a connector containing pins for opening and closing a slidable shutter which protects the electrode terminals of an integrated circuit card, the shutter exposes the electrode terminals only when the connecting terminals of the integrated circuit card are inserted into a connector. The prior art construction, does not describe the desirability or any method for removing electrical charges stored in the integrated circuit card when the card is inserted into the connector.

Accordingly, it is desirable to provide an improved construction for a connector which eliminates these problems associated with prior art devices and eliminates the flow of electrical charges when the connecting input terminals of the data input device are connected to the connector terminals of the electrical apparatus.

SUMMARY OF THE INVENTION

Generally speaking, in accordance with the invention, an improved construction for connecting a data input device to an electronic apparatus is provided. The construction includes a contacting member on the connector attached to the electronic apparatus for contacting input terminals of the data input device prior to contacting the connecting terminals of the connector. The contacting member is electrically coupled to the ground of the electronic apparatus so that any electrical charges stored in the data input device are removed prior to the input terminals contacting the connector terminals of the electronic apparatus.

Accordingly, it is an object of this invention to provide improved construction for electrically coupling a data input device to a connector of an electronic apparatus.

Another object of the invention is to provide an improved construction for removing electrical charges stored in a data input device when the device is connected to an electronic apparatus.

Still other objects and advantages of the invention will in part be obvious and will in part be apparent from the specification and drawings.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings in which:

FIG. 1 is a partial sectional view of a construction for a connector for removing an electrical charge in accordance with the invention;

FIG. 2 is a side view of FIG. 1;

FIG. 3 is a plan view of a memory card;

DETAILED DESCRIPTION OF THE PREFERRED EMBODIMENTS

Figure 4:
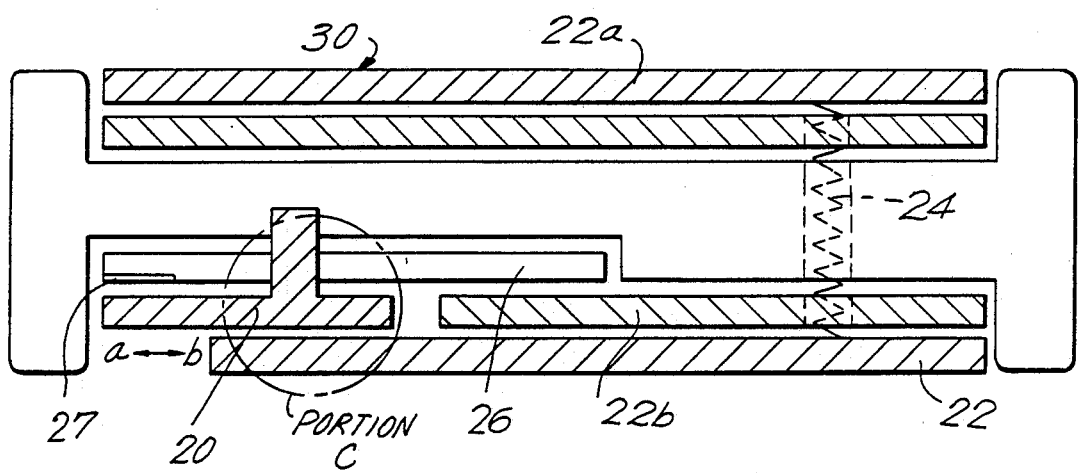
FIG. 4 is a sectional view taken along line A—A of FIG. 3.

FIG. 1 is a sectional view of a connector 10 of an electronic apparatus for receiving an input device such as a memory card 30 in accordance with the invention. FIG. 2 is a side view of connector 10. Connector 10 includes a housing 17 formed with plurality of connector terminals 16 and two contacting members 12 formed with a projection 13 to prevent the flow of electrical charges from memory card 30 to the electronic apparatus. A pair of cooperating input contacting members 21 are formed on memory card 30.

A pair of pins 15 are provided on housing 17 of connector 10 and secure connector 10 to the electronic apparatus. Contacting members 12 and pins 15 are made of an electrically conductive metal. Generally, pins 15 connect connector 10 to a substrate or to the ground of the case of an electronic apparatus.

FIG. 3 is a plan view of the terminal portion of memory card 30 which can be electrically coupled to connector 10 of FIG. 1. FIG. 4 is a cross sectional view taken along line A—A of FIG. 3. A plurality of input terminals 27 are disposed at the end of a circuit substrate 26 for connecting an integrated circuit or the like formed on substrate 26 to the electronic apparatus by contacting cooperating connector terminals 16 formed on housing 17. Circuit substrate 26 is sandwiched between an upper metal panel 22a and a lower metal panel 22b for protecting the integrated circuit against external force, static electricity, noise and the like. Metal panels 22a and 22b are connected to each other by a coil spring 24.

Slidable shutter 20 protects input terminals 27 of memory card 30 against dust, external force and static electricity. Shutter 20 is formed with two shutter projections 21 of an electrically conductive metal at the sides of memory card 30. Shutter projections 21 serve as contacting members of memory card 30.

When memory card 30 is inserted into connector 10, shutter projections 21 engage housing projections 18 and projections 13 for opening and closing shutter 20. Shutter 20 slides in the directions of arrows a and b and is biased in a closed direction by a spring (not shown). When shutter 20 is in the open position in direction b, metal panel 22b is contacted by shutter 20 as shown in the explode portion c of FIG. 4.

Figure 5:
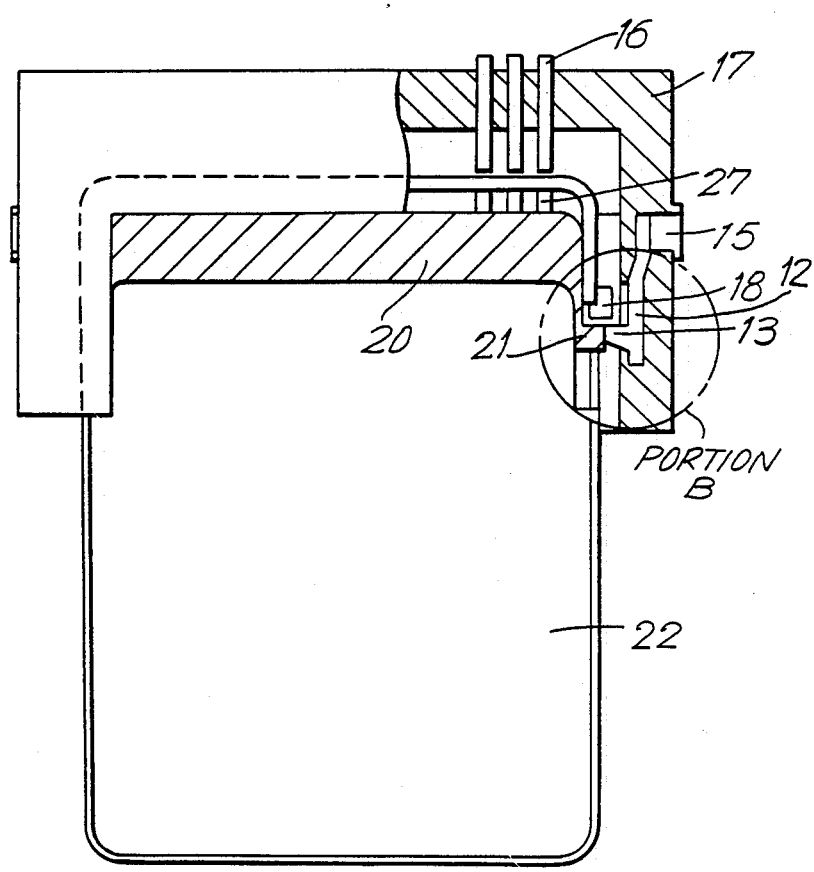
FIG. 5 shows a memory card inserted halfway into the connector of FIG. 1.
Figure 6:
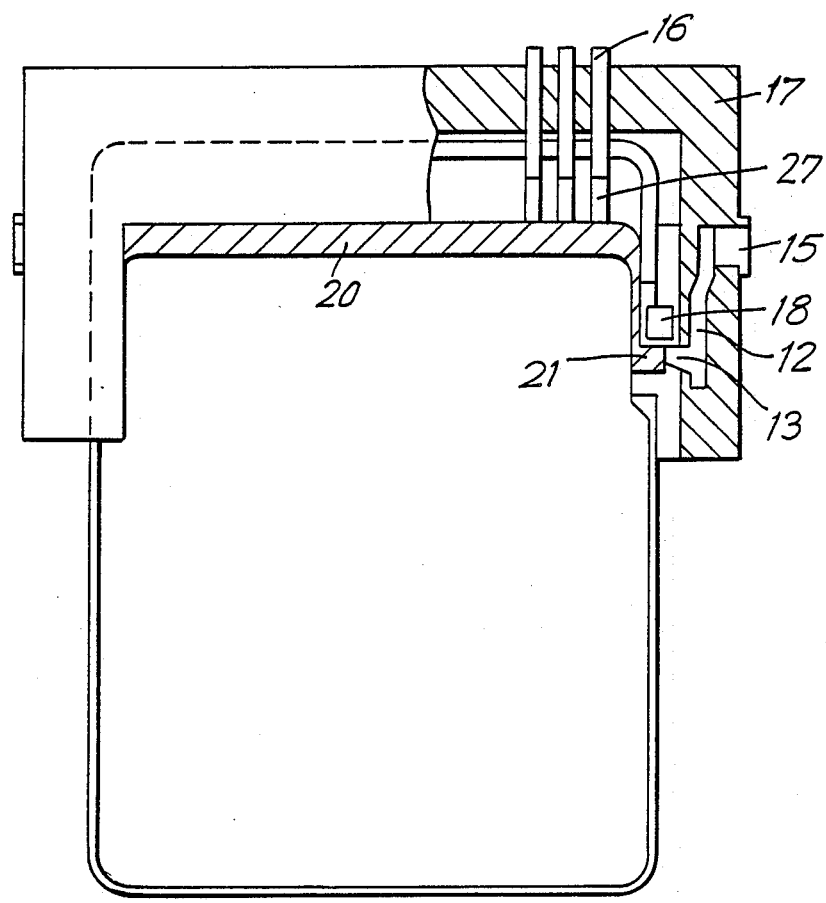
FIG. 6 shows a memory card completely inserted into the connector of FIG. 1.

FIG. 5 shows memory card 30 partially inserted into connector 10 and FIG. 6 shows it completely inserted. When memory card 30 is inserted into connector 10, prior to connector terminals 16 coming into contact with input terminals 27, projections 13 of contacting members 12 and housing projections 18 are contacted by shutter projections 21. At this time any electrical charges present in memory card 30 flows through shutter projections 21 to contacting members 12 and pins 15 to ground. As memory card 30 is inserted fully into connector 10, shutter 20 is retracted fully in direction b and connector terminals 16 are electrically connected to input terminals 27 to provide an electrical connection between memory card 10 and the electrical apparatus. Thus, a construction in accordance with the invention easily removes electrical charges in memory card 30 before connector terminals 16 are brought into contact with input terminals 27 of memory card 30 thereby avoiding any possible electrical damage to the circuits of the electrical apparatus.

When memory card 30 is fully inserted into connector 10 and input terminals 27 are coupled to contact shutter 20, contacting member 12 remains in engagement with projection 21 on shutter 20 when shutter 20 is maintained in an open position. Thus, when static electricity is generated in metal panels 22a or 22b of memory card 30, the charge flows from metal panels 22a and 22b, through shutter 20, connecting members 12 and pins 15 without adversely affecting memory card 30. The construction described above is therefore effective in preventing a memory card from being affected by static electricity.

In a further embodiment it is also possible to remove electrical charges generated in a memory card by providing patterns or terminals which are electrically conductive to the metal panels connected to a ground of an electrical apparatus.

It will thus be seen that the option set forth above among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In a construction for removing electrical charges generated in a data input device when the input device including input terminals connected to the circuitry of the input device is electrically coupled to a connector of an electronic apparatus including connector terminals connected to the electronic circuitry of the electronic apparatus, the improvement comprising:
at least one electrically conductive contacting member for removing electric charges generated in the input device, said contacting member disposed in the connector for contacting an electrically conductive portion of the input device and the input device including a contact portion for cooperating with the contacting member prior to the input terminals of the input device being connected to the connector terminals of the connector, the input device including a shutter member displaceable between a first closed position covering the input terminals and a second open position exposing the input terminals, the shutter adapted to be displaced to the second open position when inserted into the connector, the connector including an opening projection and the shutter including a shutter projection for cooperating with the opening projection to displace the shutter to the second open position when the input device is inserted into the connector.

2. The construction of claim 1, wherein said input device is a memory card.

3. The construction of claim 1, wherein the electronic apparatus includes a ground and the contacting member mounted on the connector is electrically coupled to the ground of the apparatus.

4. The construction of claim 3, wherein the shutter is formed of an electrically conductive material and the contact portion of the shutter contacts the contacting member of the connector when the shutter is displaced to the second open position and remains in contact with the contacting member when the memory card is inserted fully into the connector.

5. In a construction for removing electrical charges generated in a memory card when the memory card including input terminals connected to the circuitry of the memory card is electrically coupled to a connector of an electronic apparatus including connector terminals connected to the electronic circuitry of the electronic apparatus, the improvement comprising:
at least one electrically conductive contacting member for removing electric charges generated in the memory card, said contacting member disposed in the connector for contacting an electrically conductive portion of the memory card and the input memory card including a contact portion for cooperating with the contacting member prior to the input terminals of the memory card being connected to the connector terminals of the connector, the connector including an opening projection, the memory card including a shutter member formed of an electrically conductive material displaceable between a first closed position covering the input terminals and a second open position exposing the input terminals, the shutter including a shutter projection for cooperating with the opening projection to displace the shutter to the second open position when the memory card is inserted into the connector, the contact portion of the shutter contacts the contacting member of the connector when the shutter is displaced to the second open position and remains in contact with the contacting member when the memory card is inserted fully into the connector and wherein the memory card is substantially planar and includes a metallic plate disposed on each surface thereof electrically connected to each other and one plate is contacted by the shutter when in the second open position for removing any static charges formed in the memory card to the ground of the apparatus when the memory card is inserted into the connector.

6. A memory card for storing data to be transferred to an electronic apparatus for processing, comprising:
a circuit substrate including at least one integrated circuit for storing data to be transferred;
at least one input terminal on the circuit substrate for electrically connecting the integrated circuit to the electronic apparatus;

a pair of plates disposed on each of the circuit substrate for protecting the substrate; and an electrically conductive shutter covering at least a portion of the circuit substrate and the input terminals thereon, the shutter including a shutter contact portion for cooperating with an opening projection on a connector of an electronic apparatus to displace the shutter from a first open position covering the input terminal to a second open position exposing the input terminal, when the memory card is inserted into a connector on an electronic apparatus, the shutter formed of an electrically conductive material and the contact portion of the shutter contacts a contacting member of the connector when the shutter is displaced to the second open position.

7. A memory card for storing data to be transferred to an electronic apparatus for processing, comprising:

a circuit substrate including at least one integrated circuit for storing data to be transferred;

at least one input terminal on the circuit substrate for electrically connecting the integrated circuit to the electronic apparatus;

a pair of plates disposed on each surface of the circuit substrate for protecting the substrate; and an electrically conductive shutter covering at least a portion of the circuit substrate and the input terminals thereon, the shutter including a shutter contact portion for cooperating with an opening projection on a connector of an electronic apparatus to displace the shutter from a first open position covering the input terminal to a second open position exposing the input terminal, when the memory card is inserted into a connector on an electronic apparatus, the shutter formed of an electrically conductive material and the contact portion of the shutter contacts a contacting member of the connector when the shutter is displaced to the second open position and wherein the plates are electrically conductive and electrically connected to each other and one plate is contacted by the shutter when in the second open position whereby static charges formed in the memory card can be removed when the memory card is inserted into the connector.

* * * * *